(12) United States Patent
Hanriat et al.

(10) Patent No.: US 6,282,114 B1
(45) Date of Patent: Aug. 28, 2001

(54) LOW CONSUMPTION ROM

(75) Inventors: Stéphane Hanriat, Saint Vincent de Mercuze; Bertrand Borot, Crolles, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/577,786

(22) Filed: May 24, 2000

(30) Foreign Application Priority Data

May 25, 1999 (FR) .................................................. 99 06736

(51) Int. Cl.$^7$ ...................................................... G11C 17/00
(52) U.S. Cl. ............................................. 365/103; 365/104
(58) Field of Search ..................................... 365/103, 104

(56) References Cited

U.S. PATENT DOCUMENTS

| | | | |
|---|---|---|---|
| 4,692,902 | 9/1987 | Tanaka et al. | 365/210 |
| 5,680,357 | 10/1997 | Sung et al. | 365/210 |
| 5,828,601 * | 10/1998 | Hollmer et al. | 365/185.2 |

* cited by examiner

*Primary Examiner*—David Nelms
*Assistant Examiner*—M. Tran
(74) *Attorney, Agent, or Firm*—Theodore E. Galanthay; Robert Iannucci; Seed IP Law Group PLLC

(57) ABSTRACT

A ROM including columns of memory cells connected by columns to respective bit lines; a reference bit line; charge transistors controllable by a common charge line and respectively connecting the bit lines and the reference bit line to a high supply potential. The reference bit line is associated with a column of unprogrammed cells, and the memory includes means for activating the charge line before activation of a word line, the duration between the activation of the charge line and the activation of the word line, and the features of the charge transistors, being chosen so that the level variation of the bit lines is low as compared to the level of the high supply potential.

20 Claims, 2 Drawing Sheets

US 6,282,114 B1

LOW CONSUMPTION ROM

TECHNICAL FIELD

The present invention relates to a ROM, the structure of which enables reducing the dynamic and static power consumption.

BACKGROUND OF THE INVENTION

FIG. 1 schematically shows a conventional ROM structure. It includes a plurality of memory cells 10 arranged in rows and columns. The cells 10 of each row are selected by a respective word line W, and a selected cell presents its data on a bit line BL common to the cells of the same column. An address decoder, not shown, controls word lines W according to the read address presented to the memory.

Each bit line BL is connected to a high supply potential Vdd via a respective P-channel MOS precharge transistor MP. All precharge transistors MP are controlled by a common precharge line P.

Further, bit lines BL are connected to read amplifiers 12. Generally, the bit lines are grouped in several sets, each set being associated with a single sense amplifier 12 via a multiplexer 14. Each multiplexer 14 selects the bit line to be connected to the amplifier according to the read address presented to the memory.

As shown, the programmed cells 10 include an N-channel MOS transistor MN connected between the corresponding bit line and the low supply potential, while the unprogrammed cells 10 include no transistor. The transistors MN of the cells of a same row are all controlled by the corresponding word line W.

Generally, read amplifiers 12 are comparators that compare the outputs of the corresponding multiplexers 14 with a reference value Vref sampled on a reference bit line DBL. Reference bit line DBL corresponds to a column in which all cells are programmed. Like a normal bit line, reference bit line DBL is connected to high potential Vdd by a precharge transistor MP controlled in the same way as all other precharge transistors MP.

The elements forming the reference column are chosen so that reference bit line DBL discharges slower, during a reading, than a normal bit line BL. For this purpose, for example, the transistors forming the cells of the reference column are smaller, or less conductive, than the transistors of the cells forming the normal columns.

As illustrated to the left of FIG. 1, precharge line P is controlled in phase with the word line W selected by the address decoder. When lines P and W are low, the row is not selected and all bit lines BL and DBL are drawn to potential Vdd by transistors MP.

When lines P and W switch high, the precharge transistors MP are off while the transistors MN of the selected row are turned on and discharge their respective bit lines BL and DBL. Reference bit line DBL discharges slower than a normal bit line. Thus, the level difference between the reference bit line and a normal bit line being discharged increases and reaches a sufficient value to switch a sense amplifier 12 to a high state. The level difference between reference bit line DBL and a bit line BL that has not discharged increases in the opposite direction and reaches a value causing the switching of a sense amplifier to a low state.

A disadvantage of the ROM of FIG. 1 is that, for each read cycle, the bit lines undergo significant charge variations. Indeed, they are initially charged to Vdd to be discharged to a practically null value. This charge variation results in a high dynamic consumption proportional to the memory read frequency.

Further, in the quiescent state, precharge transistors MP are on. Although transistors MN of the memory cells are off, they exhibit a leakage current causing a static consumption. This leakage current tends to increase with new technologies due to the fact that transistors become smaller and smaller.

SUMMARY OF THE INVENTION

An object of the present invention is to provide a ROM structure enabling significant reduction of the dynamic consumption and of the static consumption.

This object is achieved by a ROM including memory cells connected by columns to respective bit lines and by rows to respective word lines; a reference bit line; sense amplifiers each connected to compare the level of a bit line with the level of the reference bit line; charge transistors controllable by a common charge line and respectively connecting the bit lines and the reference bit line to a high supply potential. The reference bit line is associated with a column of unprogrammed cells, and the memory includes means for activating the charge line before activation of a word line. The duration between the activation of the charge line and the activation of the word line, and the features of the charge transistors, are chosen so that the level variation of the bit lines is low as compared to the level of the high supply potential.

According to an embodiment of the present invention, the charge transistor associated with the reference bit line is less conductive than the other charge transistors.

According to an embodiment of the present invention, the charge transistors are less conductive than the transistors of the memory cells.

According to an embodiment of the present invention, the memory includes discharge transistors controllable by a common discharge line and respectively connecting the bit lines and the reference bit line to a low supply potential; and means for activating the discharge line after deactivating a word line.

According to an embodiment of the present invention, the read amplifiers include differential stages including differential pairs of P-channel MOS transistors.

The foregoing objects, features and advantages of the present invention will be discussed in detail in the following non-limiting description of specific embodiments in connection with the accompanying drawings.

DETAILED DESCRIPTION OF THE INVENTION

Figure 1:
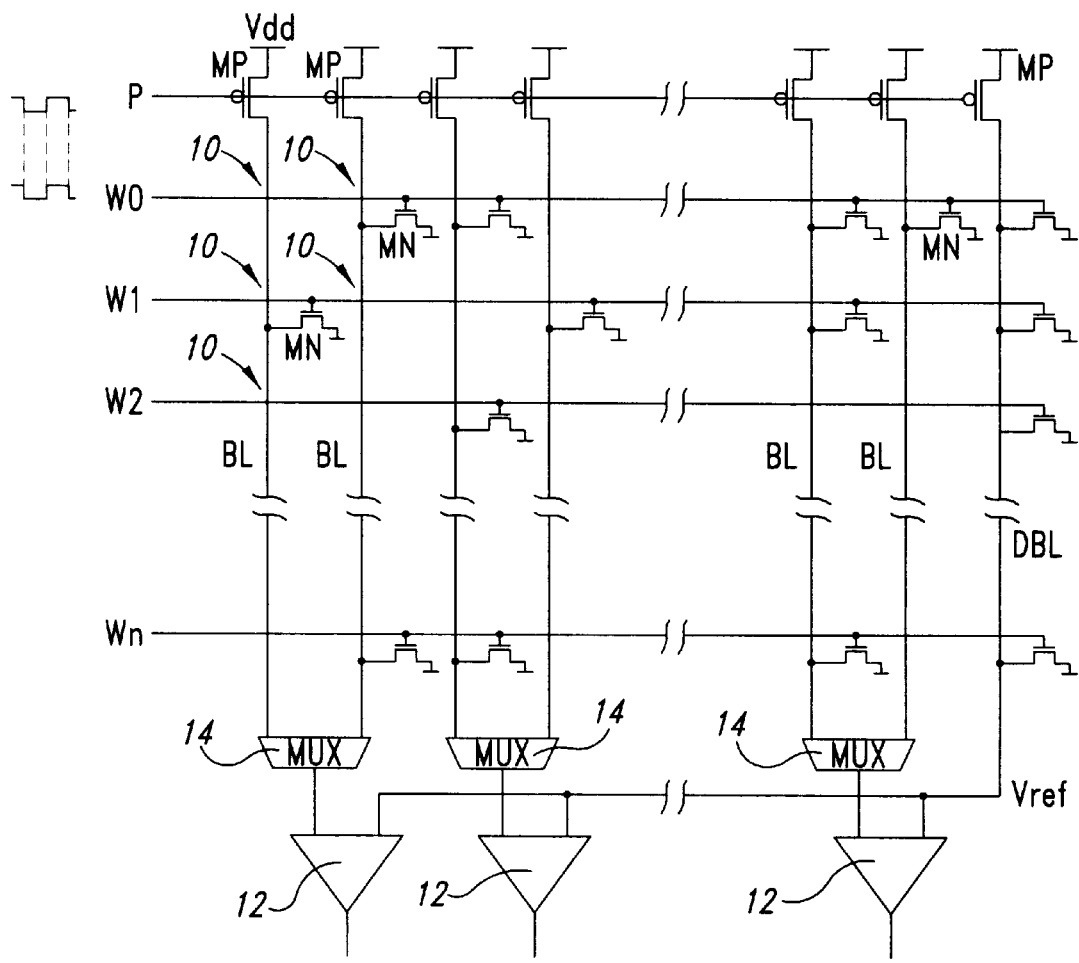
FIG. 1, previously described, schematically and partially shows a conventional ROM structure.
Figure 2:
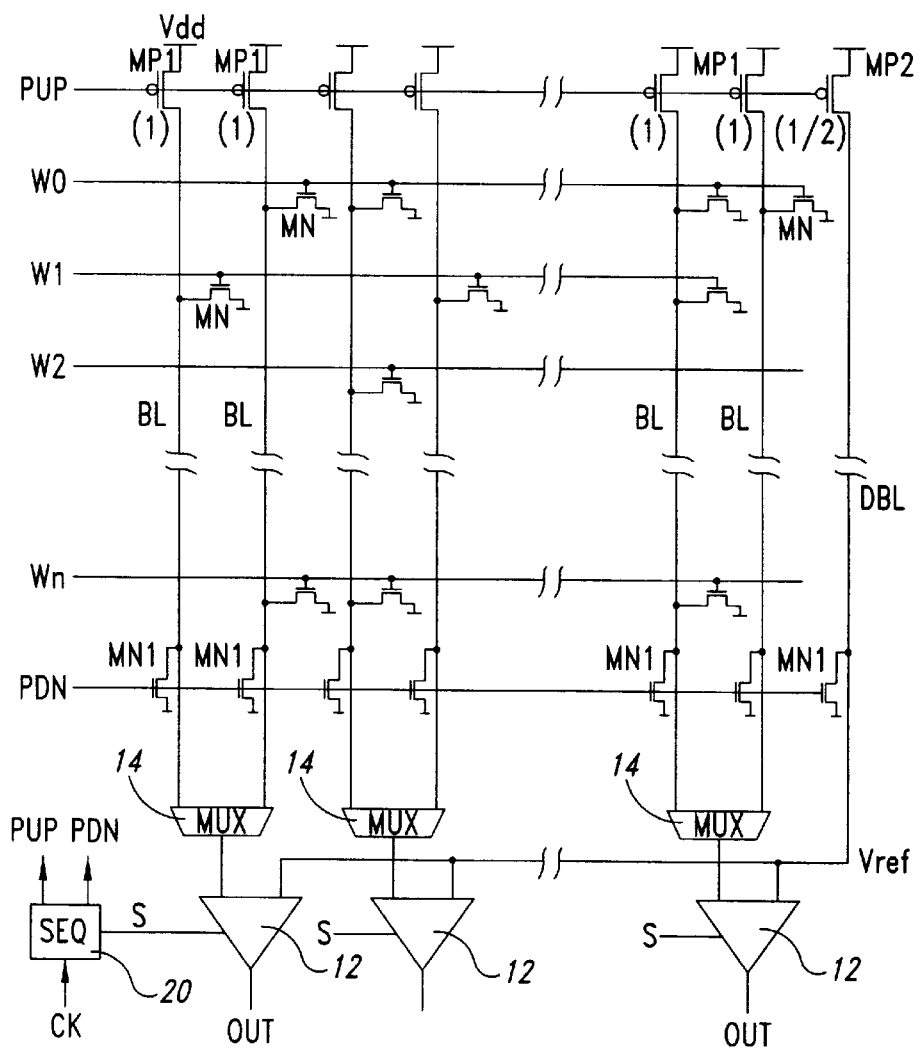
FIG. 2 schematically and partially shows an embodiment of a ROM according to the present invention.

The memory according to the embodiment of the present invention of FIG. 2 differs from the conventional memory of FIG. 1 by the function of the P-channel MOS transistors, which connect bit lines BL and reference bit line DBL to high supply potential Vdd. The P-channel MOS transistors are here designated as MP1 for normal bit lines BL and as MP2 for reference bit line DBL. The common control line of transistors MP1 and MP2 is designated herein as PUP.

The cells of the reference column are all unprogrammed, conversely to the memory of FIG. 1. However, reference bit line DBL has the same capacitance as that of FIG. 1. To achieve this, the cells of the reference column include transistors (not shown) that are not connected to word lines W.

The memory of FIG. 2 also differs by the presence of a row of N-channel MOS transistors MN1, each of which connects a respective bit line BL to the low supply potential. Reference bit line DBL is also connected to the low supply potential by a transistor MN1. Transistors MN1 are controlled by a common line PDN.

Lines PUP and PDN are controlled by a sequencer 20 according to a clock signal CK that sets the rate of the read cycles. The clock signal S also is coupled to an address decoder (not shown) that selects which word line W is activated. Thus, the sequencer 20 controls the timing of the activating of the lines PUP and PDN in coordination with the activation of the word lines through the clock signal CK and the address decoder. Sequencer 20 also provides an enable signal S to read amplifiers 12.

Figure 3:
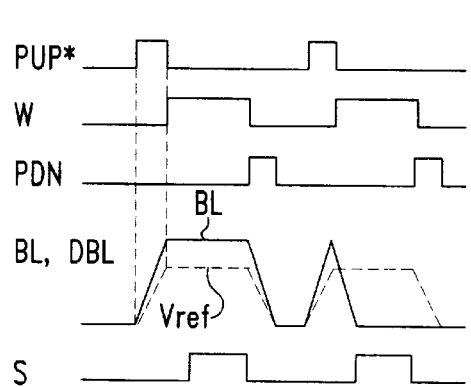
FIG. 3 shows a timing diagram illustrating the operation of the memory of FIG. 2.

FIG. 3 shows a timing diagram illustrating the operation of the memory of FIG. 2. For clarity, the complement PUP* of signal PUP that controls transistors MP1 and MP2 has been shown, since signal PUP is active when low. Thus, all the signals shown in FIG. 3 are active when high.

The successive activations of signal W correspond to read selections of any memory rows.

At a short time interval before each activation of signal W, signal PUP is activated. Bit lines BL and DBL are initially at state 0, and the activation of signal PUP begins the charge of these bit lines.

The charge speed of reference bit line DBL is voluntarily made slower than that of the other bit lines. To achieve this, for example, a transistor MP2 twice as small as transistors MP1 is chosen. Thus, as shown in dotted lines, level Vref of reference bit line DBL increases slower than the level of a normal bit line BL.

When read signal W is activated, sequencer 20 deactivates signal PUP. The levels on the normal and reference bit lines stop increasing and tend to be maintained by capacitive effect.

As shown to the left of the timing diagram, if the selected cell associated with bit line BL is not programmed, bit line BL maintains for the entire duration of activation of signal W a higher level than level Vref on the reference bit line. The duration of activation of signal PUP as well as the features of transistors MP1 and MP2 are chosen so that the level difference obtained at this stage is sufficient to switch a sense amplifier 12 and so that the level reached on line BL is low with respect to supply voltage Vdd.

If the cell selected by signal W is programmed, as shown to the right of the timing diagram, bit line BL discharges from the time when signal W is activated, to a practically null value, while level Vref on the reference bit line remains constant. Thus, at a given time, the level of line BL is sufficiently below level Vref to switch the sense amplifier to the inverse state of that of the case of an unprogrammed cell.

Signal S for enabling sense amplifiers 12 is activated soon after each enabling of read signal W, at a time when the sign of the level difference between lines BL and DBL is certain, that is, after the level crossing point in the case of a programmed cell (to the right of FIG. 3).

At the end of each reading, bit lines BL and DBL must discharge. This is obtained by activating line PDN for a short time interval after each deactivation of signal W. The activation of signal PDN turns on transistors MN1 that discharge the bit lines.

In FIG. 3, it has been assumed that signals PUP* and W do not overlap. According to an alternative, signal PUP* can remain active beyond the time of activation of signal W, provided that transistors MP1 are chosen to be less conductive than transistors MN of the memory cells. Then, in the right-hand portion of FIG. 3, when signal W is enabled, a transistor MN is turned on antagonistically to a transistor MP1. However, since transistor MP1 is less conductive than transistor MN, transistor MN decreases the level on bit line BL and the operation illustrated in FIG. 3 is obtained.

With a memory according to the present invention, the charge variations of the bit lines, and thus the current consumption, can be made particularly small. The voltage excursion on the bit lines, which directly determines the charge variations, may be chosen to be on the order of 200 millivolts, which is at least ten times smaller than the memory supply voltage and thus than the excursion undergone by the bit lines in a conventional memory. This results in a consumption decrease by a factor 10.

Further, the state of a memory cell can be evaluated by a sense amplifier as soon as the voltage difference between lines BL and DBL reaches approximately 50 mV. This value is reached particularly fast, which means that the memory latency is small. A memory that remains fast despite its low consumption is thus obtained.

Conversely to a conventional memory, the level of the bit lines in a memory according to the present invention varies in the vicinity of value 0. As a result, the sense amplifiers used in a conventional memory, provided to exploit levels varying in the vicinity of the supply voltage, may be improper.

Figure 4:
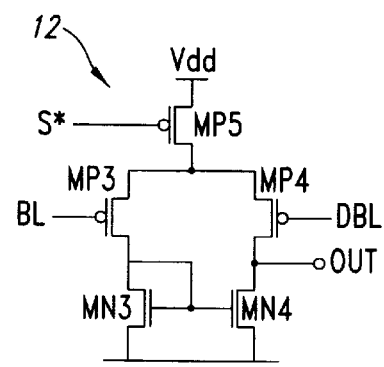
FIG. 4 shows an example of a sense amplifier to be used in the memory of FIG. 2.

FIG. 4 shows an example of a sense amplifier that can be used in a memory according to the present invention. In fact, this sense amplifier is the complementary of that used in a conventional memory. It includes a differential stage formed of two P-channel MOS transistors MP3 and MP4 connected to high supply potential Vdd by a P-channel MOS transistor MP5. Transistors MP3 and MP4 are respectively controlled by normal bit line BL and reference bit line DBL. Transistor MP5 is controlled by the complement S* of the sense amplifier enable signal.

Transistors MP3 and MP4 are further connected to the low potential via two respective N-channel transistors MN3 and MN4 connected as a current mirror. The gates of transistors MN3 and MN4 are interconnected and are connected to the drain of transistor MP3. The output OUT of the amplifier is sampled on the drains of transistors MP4 and MN4.

Amplifier 12 must generate logic levels substantially varying from 0 to supply voltage Vdd. The gain of an amplifier with a signal stage of the type in FIG. 4 may be insufficient to produce this excursion, given the small difference to be taken account of between bit lines BL and DBL. An amplifier with two gain stages is then provided.

In addition to a low dynamic consumption due to the small voltage excursion undergone by the bit lines, a memory according to the present invention also has a low static consumption. Indeed, in the quiescent state, bit lines BL are normally at state 0, whereby no leakage is possible in transistors MN of the memory cells.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A ROM, comprising:
    columns of memory cells connected to respective bit lines and rows of memory cells connected to respective word lines;
    a reference bit line associated with a column of unprogrammed cells;
    sense amplifiers each connected to compare the level of a bit line with the level of the reference bit line;
    charge transistors controllable by a common charge line and respectively connecting the bit lines and the reference bit line to a high supply potential; and
    means for activating the charge line before activation of a word line, the duration between the activation of the charge line and the activation of the word line, and the characteristics of the charge transistors, being chosen so that the bit lines have a level variation that is low as compared to the level of the high supply potential.

2. The ROM of claim 1, wherein the charge transistor associated with the reference bit line is less conductive than the other charge transistors.

3. The ROM of claim 1, wherein at least some of the memory cells are programmed memory cells that include transistors and the charge transistors are less conductive than the transistors of the memory cells.

4. The ROM of claim 1, further comprising:
    discharge transistors controllable by a common discharge line and respectively connecting the bit lines and the reference bit line to a low supply potential; and
    means for activating the discharge line after deactivating a word line.

5. The ROM of claim 1, wherein the sense amplifiers include differential stages including differential pairs of P-channel MOS transistors.

6. A ROM, comprising:
    a memory array that includes columns of memory cells connected to respective bit lines and rows of memory cells connected to respective word lines;
    a plurality of charge transistors each having a control terminal connected to a common charge line, the charge transistors respectively connecting the bit lines and the reference bit line to a high supply potential;
    a reference charge transistor having a control terminal connected to the common charge line, a first conduction terminal connected to the high supply potential, and a second conduction terminal;
    a reference bit line connected to the second conduction terminal of the reference charge transistor and having a reference voltage that is unaffected by voltage values of any of the word lines of the memory array; and
    a plurality of sense amplifiers each connected to a respective one of the bit lines and the reference bit line and each structured to compare a voltage of its respective bit line to the reference voltage of the reference bit line.

7. The ROM of claim 6, further comprising a sequencer that activates the charge line before activation of a selected one of the word lines during a phase of accessing the row of memory cells connected to the selected word line, the sequencer activating the charge line sufficiently close to the activation of the selected word line that the bit lines are charged only to a value closer to a ground potential than to the high supply potential.

8. The ROM of claim 6 wherein the reference charge transistor is less conductive than the charge transistors connected to the bit lines such that the bit lines charge faster than the reference bit line.

9. The ROM of claim 6 wherein at least some of the memory cells are programmed memory cells that include transistors and the charge transistors are less conductive than the transistors of the memory cells.

10. The ROM of claim 6, further comprising a sequencer that activates the charge line before activation of a selected one of the word lines during a phase of accessing the row of memory cells connected to the selected word line, the sequencer continuing to activate the charge line during the activation of the selected word line.

11. The ROM of claim 6, further comprising:
    discharge transistors respectively connecting the bit lines and the reference bit line to a low supply potential, each discharge transistor include a control terminal coupled to a common discharge line.

12. The ROM of claim 11, further comprising:
    means for activating the discharge line to activate all of the discharge transistors and thereby discharge the bit lines and reference bit line after activating and deactivating a selected one of the word lines during a phase of accessing the row of memory cells connected to the selected word line.

13. The ROM of claim 6 wherein each sense amplifier includes a differential stage having differential pair of P-channel MOS transistors.

14. A method of accessing a ROM that includes a memory array with columns of memory cells connected to respective bit lines and rows of memory cells connected to respective word lines; a reference bit line; and a plurality of sense amplifiers each connected to a respective one of the bit lines and the reference bit line, the memory cells of the memory array including at least some programmed memory cells having cell transistors each with a control terminal coupled to a respective one of the word lines and conduction terminals connected between a respective one of the bit lines and a first reference voltage, the method comprising:
    charging each of the bit lines and the reference bit line to a charged state;
    activating a selected one of the word lines, thereby discharging, through a selected cell transistor coupled to the selected word line, a selected bit line coupled to the selected cell transistor; and
    comparing a voltage of the selected bit line, after activating the selected word line to discharge the selected bit line, to a reference voltage of the reference bit line in the charged state.

15. The method of claim 14 wherein the ROM includes charge transistors respectively connected to the bit lines and the reference bit line, the method further comprising activating a charge line connected to control terminals of the charge transistors before activating the selected word line during a phase of accessing the row of memory cells connected to the selected word line, wherein the charge line is activated sufficiently close to the activation of the selected word line that the bit lines are charged only to a value closer to the first reference voltage than to a second reference voltage that is used to charge the bit lines and that is higher than the first reference voltage.

16. The method of claim 14 wherein the charging step includes charging the bit lines faster than the reference bit line.

17. The method of claim 14 wherein the ROM includes charge transistors respectively connected to the bit lines, each charge transistor having a control terminal coupled to a charge line, the charging step includes activating the charge line and the step of activating the selected word line includes keeping the selected word line activated while the charge line remains active.

18. The method of claim 14, further comprising:
   after the comparing step, discharging the reference bit line and whichever bit lines have not already been discharged during the activating step.

19. The method of claim 14 wherein the ROM includes discharge transistors respectively connecting the bit lines and the reference bit line to the first reference voltage, each discharge transistor include a control terminal coupled to a common discharge line, the method including activating the discharge line to activate all of the discharge transistors and thereby discharge the bit lines and reference bit line after the comparing step.

20. The method of claim 14 wherein the comparing step includes using a sense amplifier includes a differential stage having differential pair of first and second PMOS transistors, the first PMOS transistor having a control terminal coupled to the reference bit line and the second PMOS transistor having a control terminal coupled to the selected bit line.

* * * * *